(12) United States Patent
Ishikawa et al.

(10) Patent No.: US 12,323,128 B2
(45) Date of Patent: Jun. 3, 2025

(54) OSCILLATOR

(71) Applicant: KYOCERA Corporation, Kyoto (JP)

(72) Inventors: Hiroyuki Ishikawa, Kyoto (JP); Takao Kusuki, Kyoto (JP); Masaaki Ota, Kyoto (JP); Takahiro Ueta, Kyoto (JP)

(73) Assignee: KYOCERA Corporation, Kyoto (JP)

(*) Notice: Subject to any disclaimer, the term of this patent is extended or adjusted under 35 U.S.C. 154(b) by 10 days.

(21) Appl. No.: 18/450,816

(22) Filed: Aug. 16, 2023

(65) Prior Publication Data

US 2023/0396232 A1 Dec. 7, 2023

Related U.S. Application Data

(63) Continuation of application No. PCT/JP2022/001329, filed on Jan. 17, 2022.

(30) Foreign Application Priority Data

Feb. 26, 2021 (JP) .................... 2021-030167

(51) Int. Cl.
| | |
|---|---|
| *H03H 9/05* | (2006.01) |
| *H03B 5/04* | (2006.01) |
| *H03B 5/32* | (2006.01) |
| *H03H 9/17* | (2006.01) |

(52) U.S. Cl.
CPC ............ *H03H 9/0538* (2013.01); *H03B 5/04* (2013.01); *H03B 5/32* (2013.01); *H03H 9/17* (2013.01)

(58) Field of Classification Search
CPC ...... H03H 9/0547; H03H 9/0561; H03H 9/19; H03H 9/17; H03H 9/0538; H03H 9/10; H03B 5/32; H03B 1/02; H03L 1/02; H03L 1/028; H03L 1/04
See application file for complete search history.

(56) References Cited

U.S. PATENT DOCUMENTS

| | | | |
|---|---|---|---|
| 2013/0038400 A1* | 2/2013 | Asamura | H03L 1/025 331/158 |
| 2019/0267941 A1* | 8/2019 | Obata | H03B 5/32 |
| 2020/0274489 A1* | 8/2020 | Nishizawa | H03B 5/04 |

FOREIGN PATENT DOCUMENTS

| | | | |
|---|---|---|---|
| JP | 2004-356757 A | | 12/2004 |
| JP | 2012129679 A | * | 7/2012 |
| JP | 2014-107862 A | | 6/2014 |
| JP | 2019-153850 A | | 9/2019 |
| JP | 2019-153851 A | | 9/2019 |

(Continued)

*Primary Examiner* — Ryan Johnson
(74) *Attorney, Agent, or Firm* — Volpe Koenig

(57) ABSTRACT

A voltage-controlled oscillator includes a piezoelectric element, a first package, an electronic element, and a second package. The first package contains the piezoelectric element. The second package contains the electronic element and the first package. The second package includes a base, and a lid. The electronic element and the first package are mounted in the base. The lid hermetically seals the electronic element and the first package together with the base. The base includes a substrate part, a first frame part, and a second frame part. The substrate part includes a first major face and a second major face opposite to the first face. The electronic element is mounted on the first major face. The first frame part includes a first frame face on which the first package is mounted. The first frame part is located on a peripheral edge of the first major face.

2 Claims, 6 Drawing Sheets

(56) References Cited

FOREIGN PATENT DOCUMENTS

| JP | 2020-136990 A | 8/2020 |
| JP | 2020-137026 A | 8/2020 |

* cited by examiner

OSCILLATOR

TECHNICAL FIELD

The present disclosure relates to an oscillator such as a voltage-controlled crystal oscillator (VCXO) or a temperature-compensated crystal oscillator (TCXO).

TECHNICAL BACKGROUND

Piezoelectric devices including a piezoelectric element and an electronic element are in widespread use. Examples of such piezoelectric devices include VCXOs and TCXOs.

Some known piezoelectric devices include a piezoelectric element doubly sealed by two packages. In this case, a first package housing the piezoelectric element is shut off from the surrounding atmosphere by a second package. This helps to reduce the risk that temperature changes in the surrounding atmosphere may propagate to reach the piezoelectric element. This in turn leads to stabilization of oscillation frequency.

For example, Patent Literatures 1 and 2 each disclose a TCXO. In the disclosed TCXO, the piezoelectric element is housed within a first package, and the first package and the electronic element are housed within a second package. To make the temperature of the piezoelectric element within the first package, and the temperature of a temperature sensor within the electronic element close to each other, in Patent Literature 1, the first package and the electronic element are mounted on the same face of a substrate, and in Patent Literature 2, the first package and the electronic element are respectively mounted on the front and back faces of a substrate. This leads to improved accuracy of temperature compensation for oscillation frequency.

CITATION LIST

Patent Literature

Patent Literature 1: Japanese Unexamined Patent Application Publication No. 2014-107862
Patent Literature 2: Japanese Unexamined Patent Application Publication No. 2019-153851

SUMMARY

According to the present disclosure, an oscillator includes a piezoelectric element, a first package, an electronic element, and a second package.

The piezoelectric element outputs a signal with a predetermined oscillation frequency.

The first package contains the piezoelectric element.

The electronic element controls the oscillation frequency by use of voltage.

The second package contains the electronic element and the first package.

The second package includes a base, and a lid. The electronic element and the first package are mounted in the base. The lid hermetically seals the electronic element and the first package together with the base.

The base includes a substrate part, a first frame part, and a second frame part. The substrate part includes a first major face and a second major face opposite to the first major face. The electronic element is mounted on the first major face. The first frame part includes a first frame face on which the first package is mounted. The first frame part is located on a peripheral edge of the first major face. The second frame part includes a second frame face to which the lid is joined. The second frame part is located on a peripheral edge of the first frame face.

DETAILED DESCRIPTION

Figure 1:
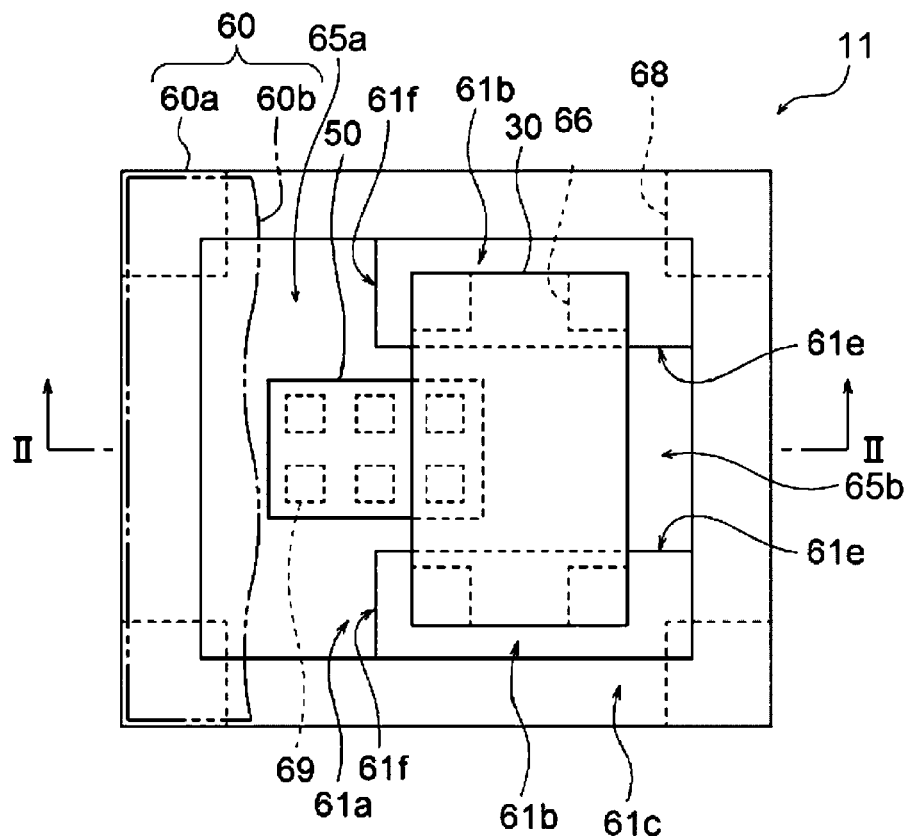
FIG. 1 is a plan view of a voltage-controlled oscillator according to Embodiment 1.

Modes for implementing the present disclosure (to be referred to as "embodiments" hereinafter) are described below with reference to the attached drawings. In the specification and the drawings, substantially identical components are designated by the same reference signs to avoid repetitive descriptions. Various shapes in the drawings are illustrated with priority given to ease of illustration and description, and thus not necessarily to scale in terms of dimensions and proportions. In the embodiments below, a voltage-controlled oscillator is described as an example of an oscillator according to the present disclosure.

Embodiment 1

A voltage-controlled oscillator 11 according to Embodiment 1 is described below with reference to FIGS. 1 to 5. FIG. 1 illustrates the voltage-controlled oscillator 11 with a lid 60*b* removed. FIGS. 3 and 4 illustrate bases 60*a* and 30*a* in partially cutaway view. The internal structure (a piezoelectric element 20 and other components) of a first package 30 is illustrated only in FIGS. 4 and 5.

The voltage-controlled oscillator 11 includes the piezoelectric element 20, the first package 30, an electronic element 50, and a second package 60. The piezoelectric element 20 outputs a signal with a predetermined oscillation frequency. The first package 30 contains the piezoelectric element 20. The electronic element 50 controls the oscillation frequency by use of voltage. The second package 60 contains the electronic element 50 and the first package 30. The second package 60 includes the base 60*a*, and the lid 60*b*. The electronic element 50 and the first package 30 are mounted in the base 60*a*. The lid 60*b* hermetically seals the electronic element 50 and the first package 30 together with the base 60*a*. The base 60*a* includes a substrate part 63, a first frame part 64*a*, and a second frame part 64*b*. The substrate part 63 includes a first major face 61*a* and a second major face 62 opposite to the first major face 61*a*. The electronic element 50 is mounted on the first major face 61*a*. The first frame part 64*a* includes a first frame face 61*b* on which the first package 30 is mounted. The first frame part 64a is located on a peripheral edge of the first major face 61a. The second frame part 64b includes a second frame face 61c to which the lid 60b is joined. The second frame part 64b is located on a peripheral edge of the first frame face 61b.

The first package 30 and the electronic element 50 may partially overlap each other when viewed in a plan view. A spare space 65b may be located between the first package 30 and the first major face 61a. The spare space 65b allows the electronic element 50 to be mounted in the spare space 65b.

Figure 4:
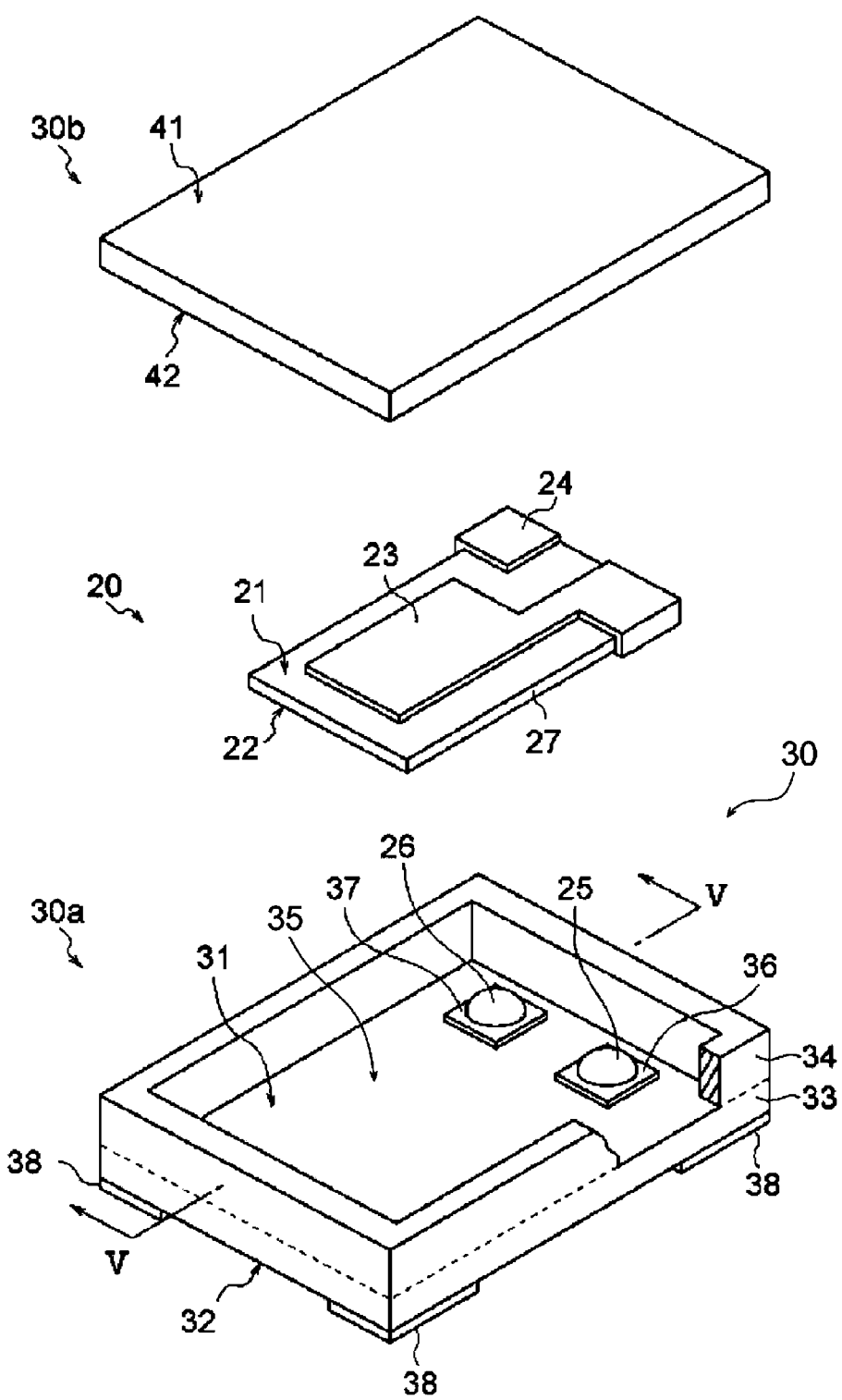
FIG. 4 is an exploded perspective view of the interior of a first package in the voltage-controlled oscillator according to Embodiment 1.
Figure 5:
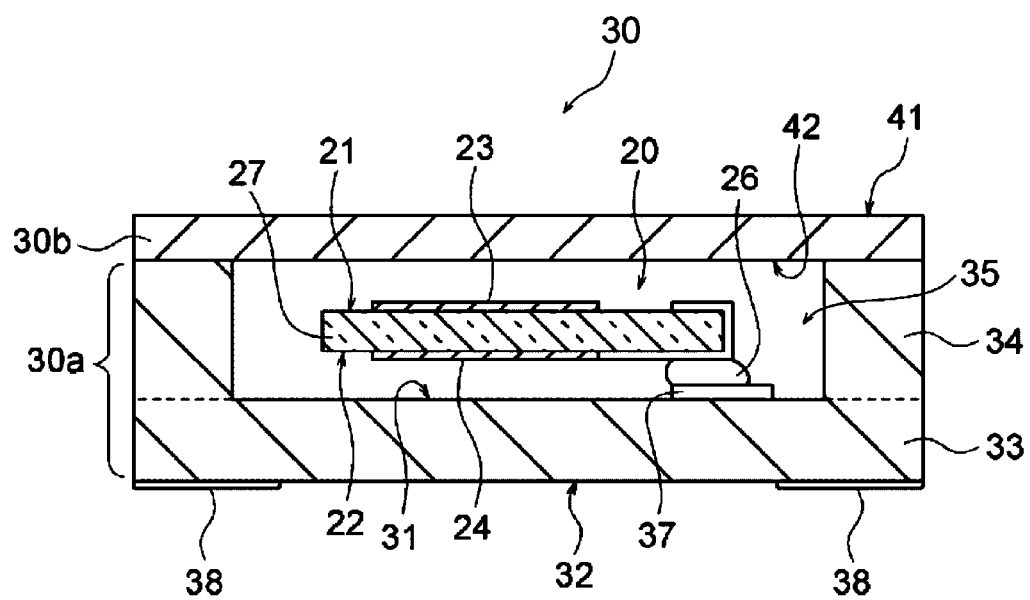
FIG. 5 is a cross-sectional view taken along a line V-V in FIGS. 3 and 4.

Referring now mainly to FIGS. 4 and 5, the piezoelectric element 20 has a substantially rectangular shape when viewed in the plan view. The piezoelectric element 20 is a crystal resonator element including a crystal blank 27, and electrodes 23 and 24. The crystal blank 27 includes a first major face 21 and a second major face 22 opposite to the first major face 21. The electrodes 23 and 24 extend from the first major face 21 of the crystal blank 27 to the second major face 22. The crystal blank 27 is, for example, an AT-cut plate. The electrodes 23 and 24 are insulated from each other. The electrodes 23 and 24 are each divided into an excitation electrode, an extended electrode, a pad electrode, or other electrode portions. The electrodes 23 and 24 extend from the first major face 21 to the second major face 22 across a lateral face of the crystal blank 27. As described above, the voltage-controlled oscillator 11 is a VCXO. The voltage-controlled oscillator 11 may be changed to a TCXO by, for example, either adding a temperature sensor and a temperature compensation function to the electronic element 50, or providing a separate temperature sensor and adding a temperature compensation function to the electronic element 50.

Now, an alternating voltage is applied to the crystal blank 27 via the electrodes 23 and 24. This causes the crystal blank 27 to vibrate in thickness shear mode such that the first major face 21 and the second major face 22 are displaced relative to each other. A specific oscillation frequency is thus generated. As described above, the piezoelectric element 20 is operable to, based on the piezoelectric and inverse piezoelectric effects of the crystal blank 27, output a signal with a predetermined oscillation frequency.

Although a thickness shear mode resonator element is used as the piezoelectric element instead of a thickness shear mode resonator element, a tuning-fork flexural mode resonator element, a contour shear mode resonator element, or other resonator elements may be used. Instead of a crystal resonator element, a piezoelectric element made of a ceramic material may be used. The piezoelectric element 20 may have any two-dimensional shape other than a rectangle. For example, the piezoelectric element 20 may have a two-dimensional shape such as a circle, an ellipse, or a polygon.

The first package 30 includes a base 30a, and a lid 30b. The piezoelectric element 20 is mounted in the base 30a. The lid 30b hermetically seals the piezoelectric element 20 when joined to the base 30a. According to Embodiment 1, the first package 30 is a piezoelectric resonator.

The base 30a includes a substrate part 33, and a frame part 34. The piezoelectric element is mounted on the substrate part 33. The frame part 34 is located on a peripheral edge of the substrate part 33. The substrate part 33 includes a first major face 31, a second major face 32, a pair of piezoelectric-element-mounting pads 36 and 37, and external terminals 38. The first major face 31 and the second major face 32 are located opposite from each other. The piezoelectric-element-mounting pads 36 and 37 are disposed on the first major face 31. Each of the external terminals 38 is disposed at a corresponding one of the four corners of the second major face 32. The frame part 34 is in the form of a rectangular frame disposed on the peripheral edge of the first major face 31 of the substrate part 33. The interior of the first package 30 defines a recessed space bounded by the substrate part 33 and the frame part 34. The electrodes 23 and 24 of the piezoelectric element 20, and the piezoelectric-element-mounting pads 36 and 37 are electrically connected with joining materials 25 and 26 such as electrically conductive adhesive, respectively. That is, the electrode 23, the joining material 25, and the piezoelectric-element-mounting pad 36 are electrically interconnected, and the electrode 24, the joining material 26, and the piezoelectric-element-mounting pad 37 are electrically interconnected.

The substrate part 33 and the frame part 34 each consist of, for example, a multilayer ceramic plate including multiple green sheets that have been stacked together and fired. Each of the piezoelectric-element-mounting pads 36 and 37, and each of the external terminals 38 are electrically interconnected by means of internal wiring (not illustrated) that is provided in the substrate part 33 and the frame part 34. The internal wiring consists of, for example, a conductor pattern or a via-hole conductor printed on the green sheets. The piezoelectric-element-mounting pads 36 and 37, and the external terminals 38 each consist of, for example, a gold (Au) layer on its surface, and the underlying nickel (Ni) layer.

The lid 30b is in the form of a rectangular flat plate. The lid 30b includes a first major face 41 and a second major face 42 opposite to the first major face 41. Examples of the material of the lid 30b include metals such as Kovar, and ceramics. The lid 30b is joined to the base 30a by electric welding, glass sealing, brazing, soldering, or other methods to hermetically seal the recessed space 35. The lid 30b and the external terminals 38 are electrically connected by means of internal wiring (not illustrated) that is provided in the substrate part 33 and the frame part 34.

Figure 2:
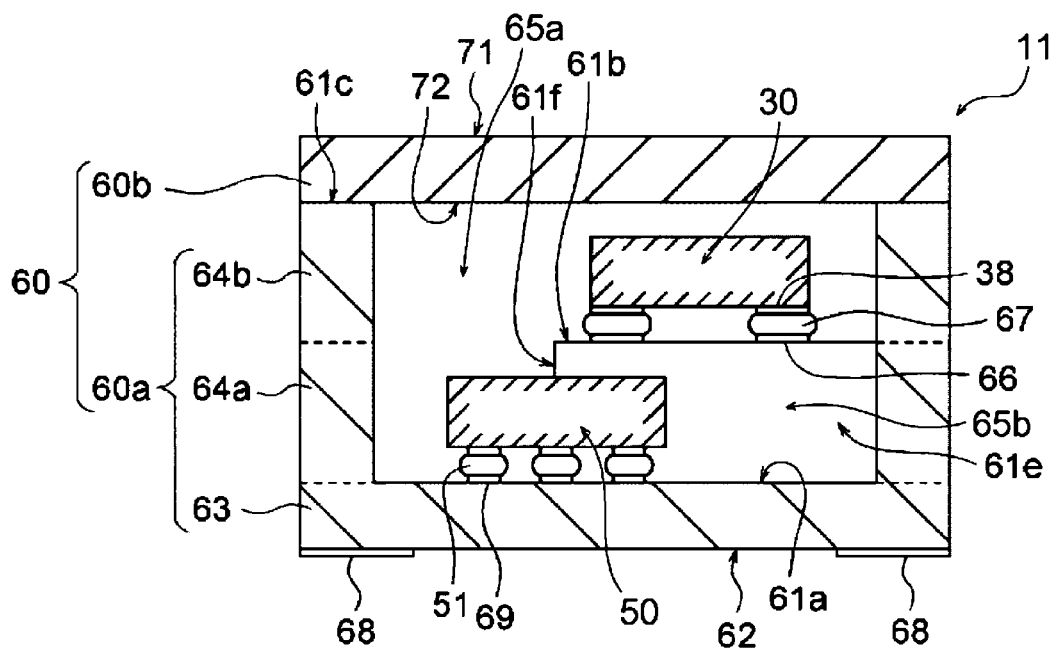
FIG. 2 is a cross-sectional view taken along a line II-II in FIG. 1.
Figure 3:
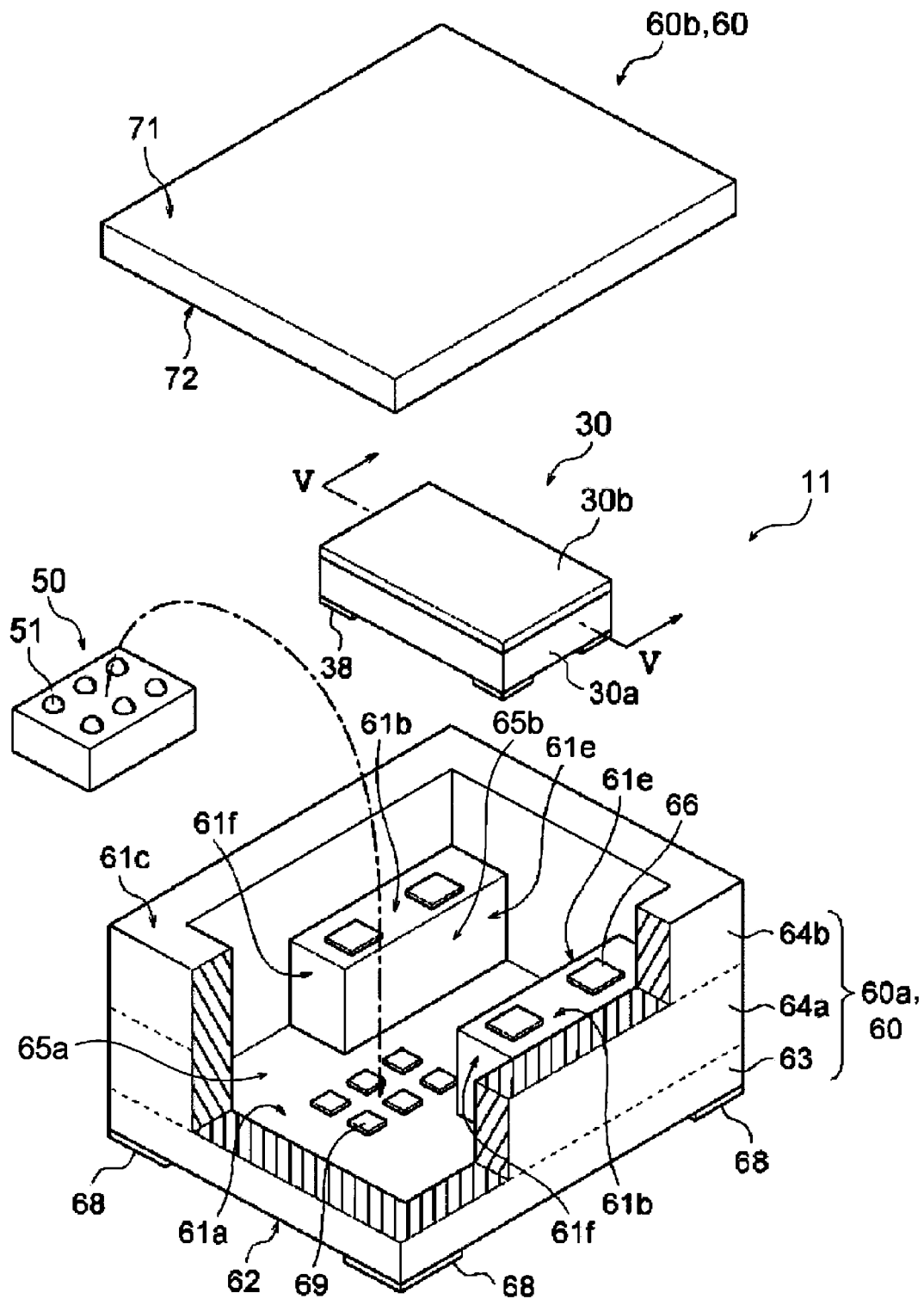
FIG. 3 is an exploded perspective view of the voltage-controlled oscillator according to Embodiment 1.

Referring now mainly to FIGS. 1 to 3, the electronic element 50 is an IC (Integrated Circuits) consisting of, for example, an oscillator circuit for the piezoelectric element 20. The electronic element 50 is a flip chip (FC) with connection terminals 51 in the form of bumps. The bumps are made of, for example, gold or solder. The bumps are electrically connected to corresponding electronic-element-mounting pads 69. The same number of connection terminals 51 as the number of electronic-element-mounting pads 69 are disposed. That is, the electronic element 50 is mounted to the base 60a via the connection terminals 51, with a circuit face of the electronic element 50 facing the electronic-element-mounting pads 69 on the first major face 61a, that is, with the circuit face facing down. The circuit face of the electronic element 50 is a face provided with a circuit and including the connection terminals 51. The electronic element 50 is not necessarily a FC but may be a resin-molded part or a packaged part. The connection terminals 51 to be used may be wires made of a material such as aluminum or gold, instead of bumps.

The electronic element 50 has a function that allows the output frequency of the piezoelectric element 20 to be varied by a control voltage input through external terminals 68. This function can be implemented by, for example, insertion of a variable capacitance diode in series with the piezoelectric element 20. The variable capacitance diode is a diode whose capacitance varies with voltage. It is to be noted, however, that the electronic element 50 does not include a temperature sensor nor a temperature compensation function.

The second package 60 includes the base 60a, and the lid 60b. The first package 30 is mounted in the base 60a. The lid 60b hermetically seals the first package 30 when joined to the base 60a. The first package 30 and the second package 60 may have any three-dimensional shape other than a cuboid, for example, a circular cylinder or an elliptic cylinder.

The base 60a includes the substrate part 63, the first frame part 64a, and the second frame part 64b. The first package 30 is mounted on the substrate part 63. The first frame part 64a is located on the peripheral edge of the substrate part 63. The second frame part 64b is located on the peripheral edge of the first frame part 64a. The substrate part 63 includes the first major face 61a, the second major face 62, the electronic-element-mounting pads 69, and the external terminals 68. The first major face 61a and the second major face 62 are located opposite from each other. The electronic-element-mounting pads 69 are disposed on the first major face 61a. Each of the external terminals 68 is disposed at a corresponding one of the four corners of the second major face 62. The first frame part 64a includes the first frame face 61b, and package-mounting pads 66 disposed on the first frame face 61b. The first frame part 64a is disposed in the form of a rectangular frame on the peripheral edge of the first major face 61a of the substrate part 63. The second frame part 64b is disposed in the form of a rectangular frame on the peripheral edge of the first frame face 61b of the first frame part 64a. The interior of the second package 60 defines a recessed space 65a bounded by the substrate part 63, the first frame part 64a, and the second frame part 64b. A portion of the recessed space 65a between the first package 30 and the first major face 61a defines the spare space 65b. The external terminals 38 of the first package 30, and the package-mounting pads 66 are electrically connected by means of joining materials 67 (FIG. 2) such as solder or electrically conductive adhesive.

The first frame part 64a is generally in the form of a rectangular frame. A portion of the first frame part 64a protrudes in the shape of a cuboid toward the spare space 65b to define a pair of first frame faces 61b. Each of the pair of first frame faces 61b is provided with two package-mounting pads 66. The first package 30 is secured on the pair of first frame faces 61b across the spare space 65b. The pair of first frame faces 61b, and the first major face 61a are connected by a pair of stepped faces 61e and a pair of stepped faces 61f The pair of stepped faces 61e face each other. Each of the pair of stepped faces 61f constitutes part of the same plane. The space located between the pair of first frame faces 61b and the first major face 61a and between the pair of stepped faces 61e (i.e., the spare space 65b) is dimensioned to allow the electronic element 50 to be housed within the space.

The substrate part 63, the first frame part 64a, and the second frame part 64b each consist of, for example, a multilayer ceramic plate including multiple green sheets that have been stacked together and fired. Each of the electronic-element-mounting pads 69, each of the package-mounting pads 66, and each of the external terminals 68 are electrically interconnected by means of internal wiring (not illustrated) that is provided in the substrate part 63, the first frame part 64a, and the second frame part 64b. The internal wiring consists of, for example, a conductor pattern or a via-hole conductor printed on the green sheets. The electronic-element-mounting pads 69, the package-mounting pads 66, and the external terminals 68 each consist of, for example, a gold (Au) layer on its surface, and the underlying nickel (Ni) layer.

The lid 60b is in the form of a rectangular flat plate. The lid 60b includes a first major face 71 and a second major face 72 opposite to the first major face 71. Examples of the material of the lid 60b include metals such as Kovar, and ceramics. The lid 60b is joined to the base 60a by electric welding, glass sealing, brazing, soldering, or other methods to hermetically seal the recessed space 65a. The lid 60b and the external terminals 68 are electrically connected by means of internal wiring (not illustrated) that is provided in the substrate part 63, the first frame part 64a, and the second frame part 64b.

A method for assembling the voltage-controlled oscillator 11 is now described below.

First, as illustrated in FIG. 4, the joining materials 25 and 26 consisting of electrically conductive adhesive are respectively applied to the piezoelectric-element-mounting pads 36 and 37 on the first major face 31 of the substrate part 33. The electrodes 23 and 24 of the piezoelectric element 20 are then respectively placed on the joining materials 25 and 26, and subjected to heat treatment at a predetermined temperature for a predetermined time. This causes the joining materials 25 and 26 to cure. As a result, the piezoelectric element 20 is secured in a cantilever fashion on the substrate part 33. The recessed space 35 of the base 30a is then sealed with the lid 30b. The first package 30 is thus completed.

Meanwhile, as illustrated in FIG. 3, a face of the electronic element 50 provided with the connection terminals 51 is positioned to face the first major face 61a within the recessed space 65a. With the connection terminals 51 aligned with the electronic-element-mounting pads 69, the connection terminals 51 are pressed against the electronic-element-mounting pads 69 under application of heat or ultrasonic waves. As a result, the connection terminals 51 are joined to the electronic-element-mounting pads 69, and the electronic element 50 is thus mounted within the second package 60.

Subsequently, as illustrated in FIG. 3, with the external terminals 38 aligned with the package-mounting pads 66, the first package 30 is secured on the first major face 61a within the second package 60 via the joining materials 67 (FIG. 2). The first package 30 is thus mounted within the second package 60.

Lastly, as illustrated in FIG. 2, the recessed space 65a of the second package 60 is sealed with the lid 60b. The voltage-controlled oscillator 11 is thus completed.

To mount the voltage-controlled oscillator 11 configured as described above to a surface of a printed wiring board of an electronic apparatus, the bottom face of the external terminals 68 is secured to the printed wiring board by use of solder, Au bumps, electrically conductive adhesive, or other means. The voltage-controlled oscillator 11 is used as an oscillation source in, for example, various electronic apparatuses such as personal computers, clocks, gaming consoles, communication apparatuses, or vehicle-mounted apparatuses such as car navigation systems.

Operation and effects of the voltage-controlled oscillator 11 are now described below.

(1) In the voltage-controlled oscillator 11, the piezoelectric element 20 is housed within the first package 30, and the first package 30 and the electronic element 50 are housed within the second package 60. According to the above-mentioned structure of the voltage-controlled oscillator 11, the first package 30 housing the piezoelectric element 20 is shut off from the surrounding atmosphere by the second package 60. This helps to reduce the risk that temperature changes in the surrounding atmosphere may propagate and reach the piezoelectric element 20. This in turn leads to stabilization of oscillation frequency.

(2) As described above, in the TCXO disclosed in each of Patent Literatures 1 and 2, the piezoelectric element is housed within the first package, and the first package and the electronic element are housed within the second package. To make the temperature of the piezoelectric element within the first package, and the temperature of the temperature sensor within the electronic element close to each other, in Patent Literature 1, the first package and the electronic element are mounted on the same face of the substrate, and in Patent Literature 2, the first package and the electronic element are respectively mounted on the front and back faces of the substrate. This leads to improved accuracy of temperature compensation for oscillation frequency.

However, miniaturization of an oscillator inherently requires that the piezoelectric element and the electronic element be placed in close proximity to each other. Consequently, applying the configurations disclosed in Patent Literatures 1 and 2 to an oscillator may give rise to the following issues.
  (a) The heat generated in the electronic element tends to propagate to the piezoelectric element.
  (b) The strain generated in the substrate during mounting of the electronic element tends to remain as stress exerted on the piezoelectric element.

These issues may cause instability in the oscillation frequency of the oscillator. These issues are particularly pronounced when the above-mentioned configurations are applied to a voltage-controlled oscillator with no temperature sensor and no temperature compensation function.

To address these issues, according to Embodiment 1, the electronic element 50 is mounted on the first major face 61*a*, and the first package 30 is mounted on the first frame face 61*b*. In this case, the first major face 61*a* and the first frame face 61*b* are not in the same plane, nor are these faces the front and back faces of a substrate. As a result, the electronic element 50 and the piezoelectric element 20 can be spaced sufficiently away from each other. This helps to reduce the risk that heat generated in the electronic element 50 may propagate to the piezoelectric element 20, and also reduce the risk that strain generated in the substrate part 63 upon mounting of the electronic element 50 may affect the piezoelectric element 20. The above-mentioned configuration of the voltage-controlled oscillator 11, coupled with the effect described in the item (1) above, therefore makes it possible to achieve further stabilization of oscillation frequency.

(3) In Embodiment 1, the first package 30 and the electronic element 50 partially overlap each other when viewed in the plan view. The spare space 65*b* is located between the first package and the first major face 61*a*. The spare space 65*b* allows the electronic element 50 to be mounted in the spare space 65*b*. In this case, even if the electronic element 50 is increased in size, the electronic element 50 can be mounted such that the electronic element 50 extends into and within the spare space 65*b*. This allows the electronic element 50 to be housed within the second package 60. This leads to improved design flexibility for the electronic element 50.

Embodiment 2

Figure 6:
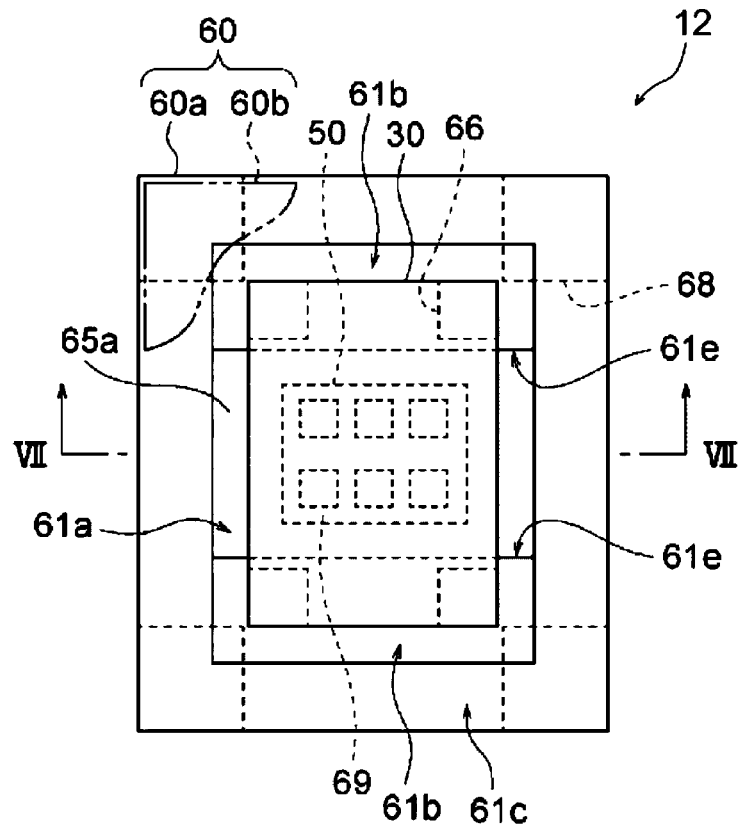
FIG. 6 is a plan view of a voltage-controlled oscillator according to Embodiment 2.
Figure 7:
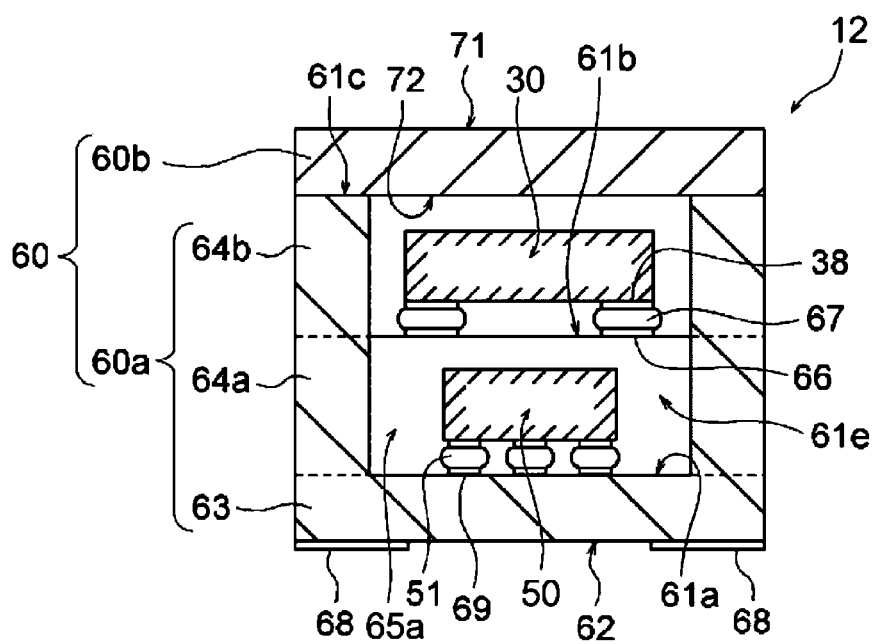
FIG. 7 is a cross-sectional view taken along a line VII-VII in FIG. 6.

A voltage-controlled oscillator 12 according to Embodiment 2 is described below with reference to FIGS. 6 and 7. FIG. 6 illustrates the voltage-controlled oscillator 12 with the lid removed.

In the voltage-controlled oscillator 12, when viewed in the plan view, the first package 30 and the electronic element 50 overlap each other with the electronic element 50 being hidden inside the first package 30.

The first frame part 64*a* is generally in the form of a rectangular frame. A portion of the first frame part 64*a* protrudes in the shape of a cuboid toward the recessed space 65*a* to define the pair of first frame faces 61*b*. Each of the pair of first frame faces 61*b* is provided with two package-mounting pads 66. The first package 30 is secured on the pair of first frame faces 61*b* across the electronic element 50. The pair of first frame faces 61*b*, and the first major face 61*a* are connected by the pair of stepped faces 61*e*. The pair of stepped faces 61*e* face each other. The space located between the pair of first frame faces 61*b* and the first major face 61*a* and between the pair of stepped faces 61*e* is dimensioned to allow the electronic element 50 to be housed within the space.

According to the above-mentioned configuration of the voltage-controlled oscillator 12, the first package 30 and the electronic element 50 overlap each other with the electronic element being hidden inside the first package 30 in the plane view. This makes it possible to reduce the area occupied by the voltage-controlled oscillator 12, and consequently achieve miniaturization of the voltage-controlled oscillator 12. Embodiment 2 is otherwise the same, and/or similar to, Embodiment 1 in configuration, operation, and effects.

Embodiment 3

Figure 8:
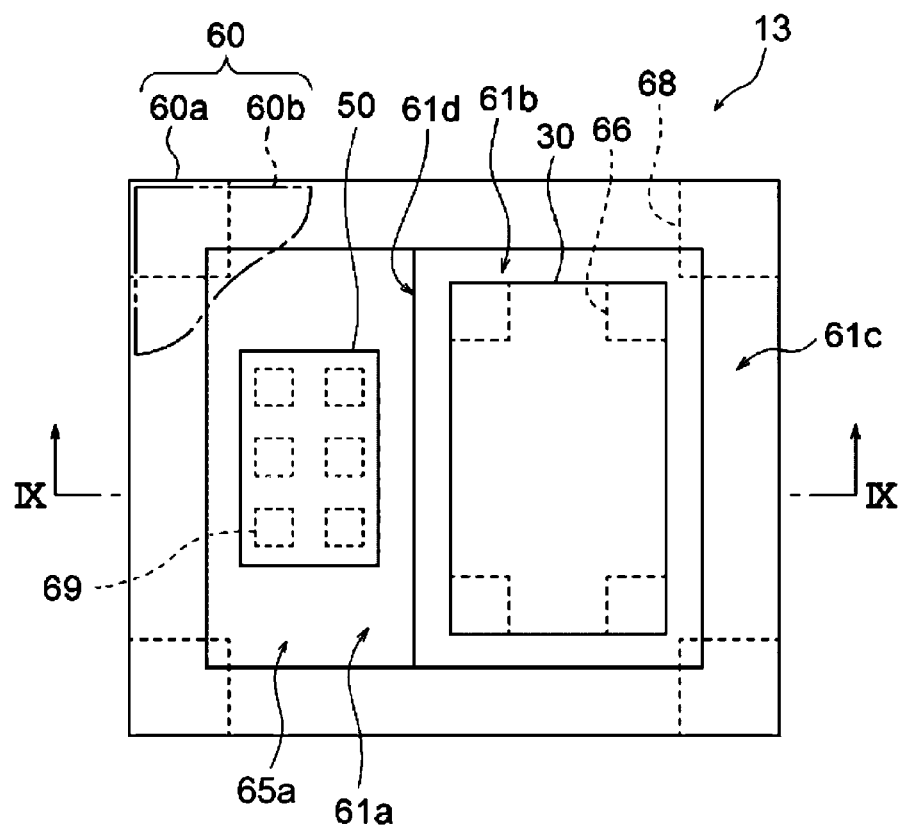
FIG. 8 is a plan view of a voltage-controlled oscillator according to Embodiment 3.
Figure 9:
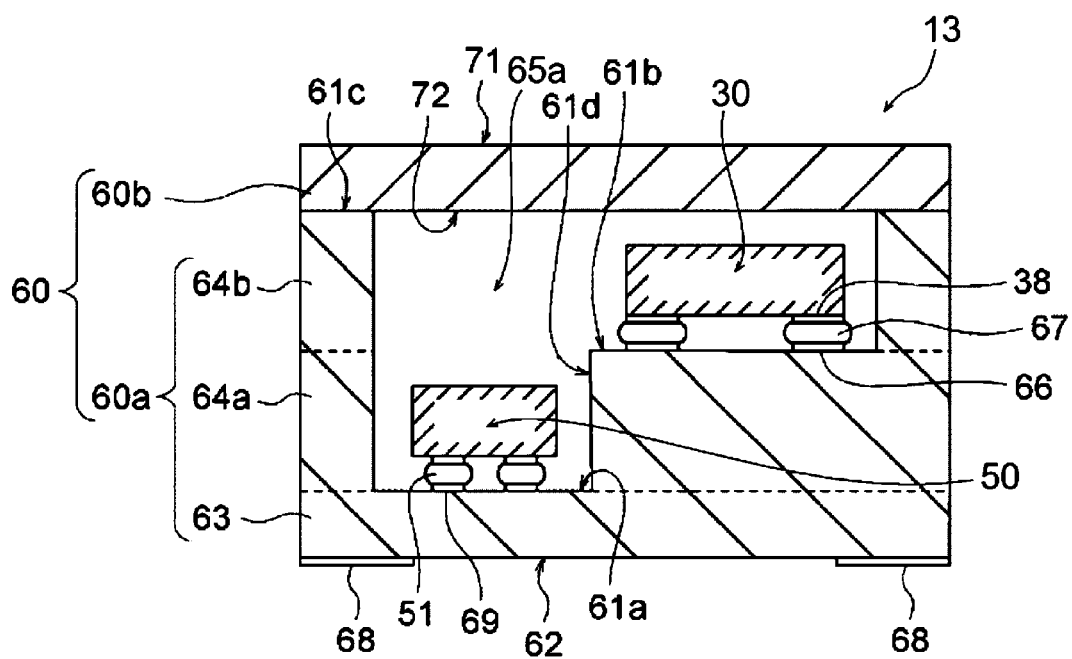
FIG. 9 is a cross-sectional view taken along a line IX-IX in FIG. 8.

A voltage-controlled oscillator 13 according to Embodiment 3 is described below with reference to FIGS. 8 and 9. FIG. 8 illustrates the voltage-controlled oscillator 13 with the lid removed.

In the voltage-controlled oscillator 13, the first package 30 and the electronic element 50 do not overlap each other when viewed in the plan view, and the first major face 61*a* and the first frame face 61*b* are separated from each other via a single stepped face 61*d*.

The first frame part 64*a* is generally in the form of a rectangular frame. A portion of the first frame part 64*a* protrudes in the shape of a cuboid toward the recessed space 65*a* to define a single first frame face 61*b*. The single first frame face 61*b* is provided with four package-mounting pads 66. The first package 30 is mounted on the single first frame face 61*b*. The single first frame face 61*b* and the first major face 61*a* are connected by a single stepped face 61*d*.

According to the above-mentioned configuration of the voltage-controlled oscillator 13, the first major face 61*a* and the first frame face 61*b* are separated from each other via the single stepped face 61*d*. The electronic element 50 and the piezoelectric element 20 are thus spaced sufficiently away from each other by means of the first frame part 64*a* bounded by the first frame face 61*b* and the stepped face 61*d*. This helps to further reduce the risk that heat generated in the electronic element 50 may propagate to the piezoelectric element 20, and also further reduce the risk that strain generated in the substrate part 63 upon mounting of the electronic element 50 may affect the piezoelectric element 20. The above-mentioned configuration of the voltage-controlled oscillator 13 therefore makes it possible to achieve further stabilization of oscillation frequency. Embodiment 3 is otherwise the same, and/or similar to, Embodiment 1 in configuration, operation, and effects.

<Other Remarks>

Although the present disclosure has been described above with reference to the above embodiments, these embodiments are not intended to be limiting of the present disclosure. For example, although a voltage-controlled oscillator has been described above as an example of an oscillator according to the embodiments, other oscillators, such as a TCXO including a temperature sensor and a temperature compensation function, also fall within the scope of the present disclosure. Various variations as may occur to those skilled in the art can be made to the details of the features of the present disclosure. The present disclosure also encompasses any suitable combinations of some or all of the features of the embodiments.

INDUSTRIAL APPLICABILITY

The present disclosure is applicable to oscillators.

REFERENCE SIGNS 11, 12, 13 voltage-controlled oscillator
20 piezoelectric element
21 first major face
22 second major face
23, 24 electrode
26 joining material
27 crystal blank
30 first package
30a base
31 first major face
32 second major face
33 substrate part
34 frame part
35 recessed space
36, 37 piezoelectric-element-mounting pad
38 external terminal
30b lid
41 first major face
42 second major face
50 electronic element
51 connection terminal
60 second package
60a base
61a first major face
61b first frame face
61c second frame face
61d, 61e, 61f stepped face
62 second major face
63 substrate part
64a first frame part
64b second frame part
65a recessed space
65b spare space
66 package-mounting pad
67 joining material
68 external terminal
69 electronic-element-mounting pad
60b lid
71 first major face
72 second major face

The invention claimed is:

1. An oscillator comprising:
a piezoelectric element that outputs a signal with a predetermined oscillation frequency;
a first package containing the piezoelectric element;
an electronic element that controls the predetermined oscillation frequency by use of voltage; and
a second package containing the electronic element and the first package,
the second package including:
a base in which the electronic element and the first package are mounted, and
a lid that hermetically seals the electronic element and the first package with the base,
wherein the base comprises
a substrate part comprising a first major face and a second major face opposite to the first major face, the first major face being a major face on which the electronic element is mounted,
a first frame part comprising a first frame face on which the first package is mounted, the first frame part being located on a peripheral edge of the first major face, and
a second frame part comprising a second frame face to which the lid is joined, the second frame part being located on a peripheral edge of the first frame face,
wherein the first major face and the first frame face have a difference in level,
wherein the first package is mounted not on the electronic element but on the first frame face,
wherein the electronic element is mounted on the first major face such that the electronic element is partially located in a spare space between the first package and the first major face, and
wherein the piezoelectric element contained in the first package does not entirely cover the electronic element.

2. The oscillator according to claim 1, wherein the second major face of the substrate part comprises external terminals and wherein the lid is electrically connected to the external terminals by internal wiring in the substrate part, the first frame part and the second frame part.

* * * * *